US006980142B2

(12) United States Patent
Faris

(10) Patent No.: US 6,980,142 B2
(45) Date of Patent: *Dec. 27, 2005

(54) ELECTRON BEAM EXCITED SUPERCONDUCTING ANALOG-TO-DIGITAL CONVERTER

(75) Inventor: Sadeg M. Faris, Pleasantville, NY (US)

(73) Assignee: Reveo, Inc., Elmsford, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 10/657,736

(22) Filed: Sep. 8, 2003

(65) Prior Publication Data

US 2005/0035889 A1 Feb. 17, 2005

Related U.S. Application Data

(63) Continuation of application No. 10/098,906, filed on Mar. 14, 2002, now Pat. No. 6,617,987.

(51) Int. Cl.$^{7}$ .................... H03M 1/00
(52) U.S. Cl. .................... 341/126; 341/12; 250/492.2
(58) Field of Search .................... 341/126, 131, 341/137, 110, 138, 135, 155, 12; 250/492.2

(56) References Cited

U.S. PATENT DOCUMENTS 4,034,363 A * 7/1977 Van Etten et al. ............ 341/12
4,163,156 A * 7/1979 Daetwyler et al. ....... 250/492.2
6,356,221 B1 * 3/2002 LeChevalier ................ 341/137

* cited by examiner

*Primary Examiner*—Jean Bruner Jeanglaude
(74) *Attorney, Agent, or Firm*—Ralph J. Crispino

(57) ABSTRACT

A system and method for converting an analog voltage signal to a digital representation at high speeds, known as an analog to digital converter (A/D converter), is provided in the form of an N-bit A/D converter, made by N superconducting, preferably HTC, transmission lines. The N lines are arranged adjacently and in parallel with each other. On each line $2^{N-1}$ Josephson Junctions (JJs) are embedded in series. The JJs form a matrix over the configuration of the N superconducting transmission lines. A scanning electron beam is made to impinge on this arrangement across the lines at a high frequency, while it is deflected by the applied voltage signal along the direction of the lines. A voltage step is generated upon hitting any one of the JJs. In this manner upon each cross-scanning of the beam, an N-bit step voltage pattern is generated on the lines.

5 Claims, 5 Drawing Sheets

*3-bit e-beam excited superconducting ADC*

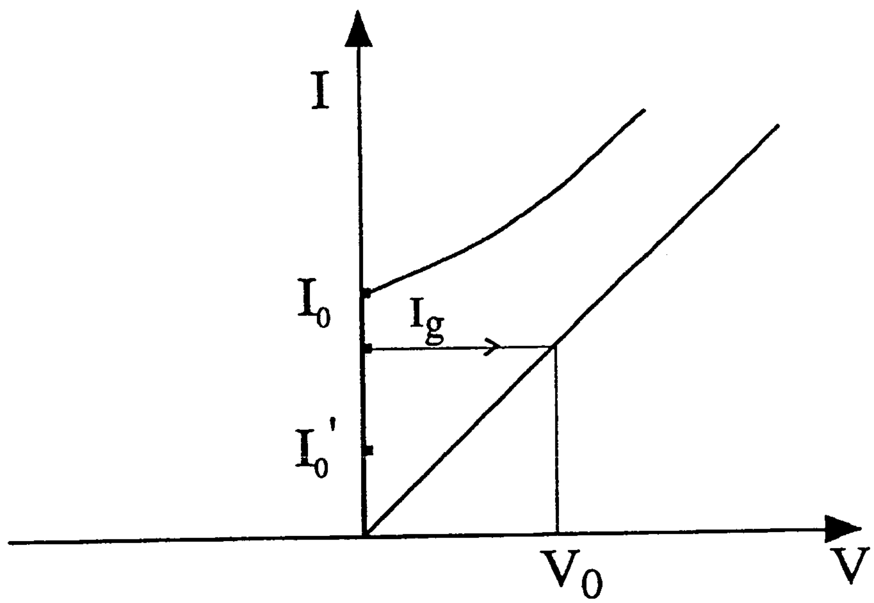
*FIG. 1 Current - volt characteristics of weaklink JJ device*
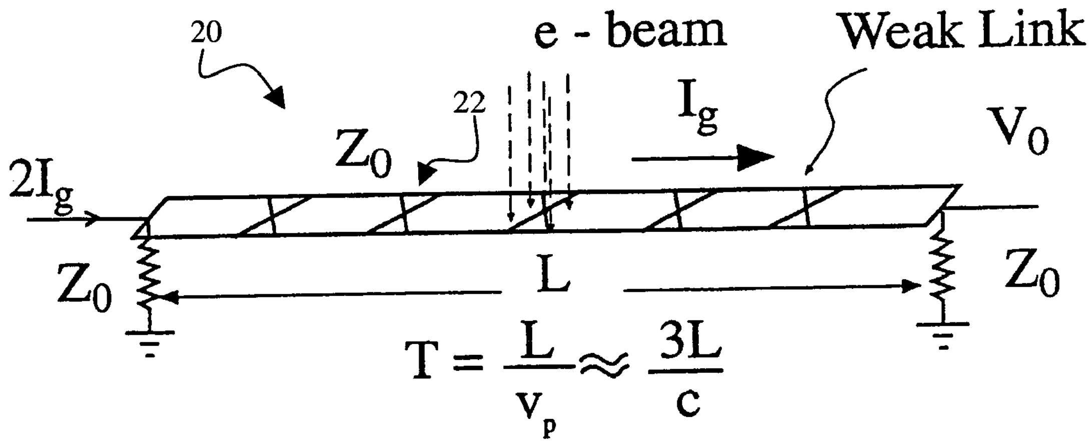
*FIG. 2* *e-beam excited dispersionless HTC superconducting line matched at both ends and contains weak links in series*

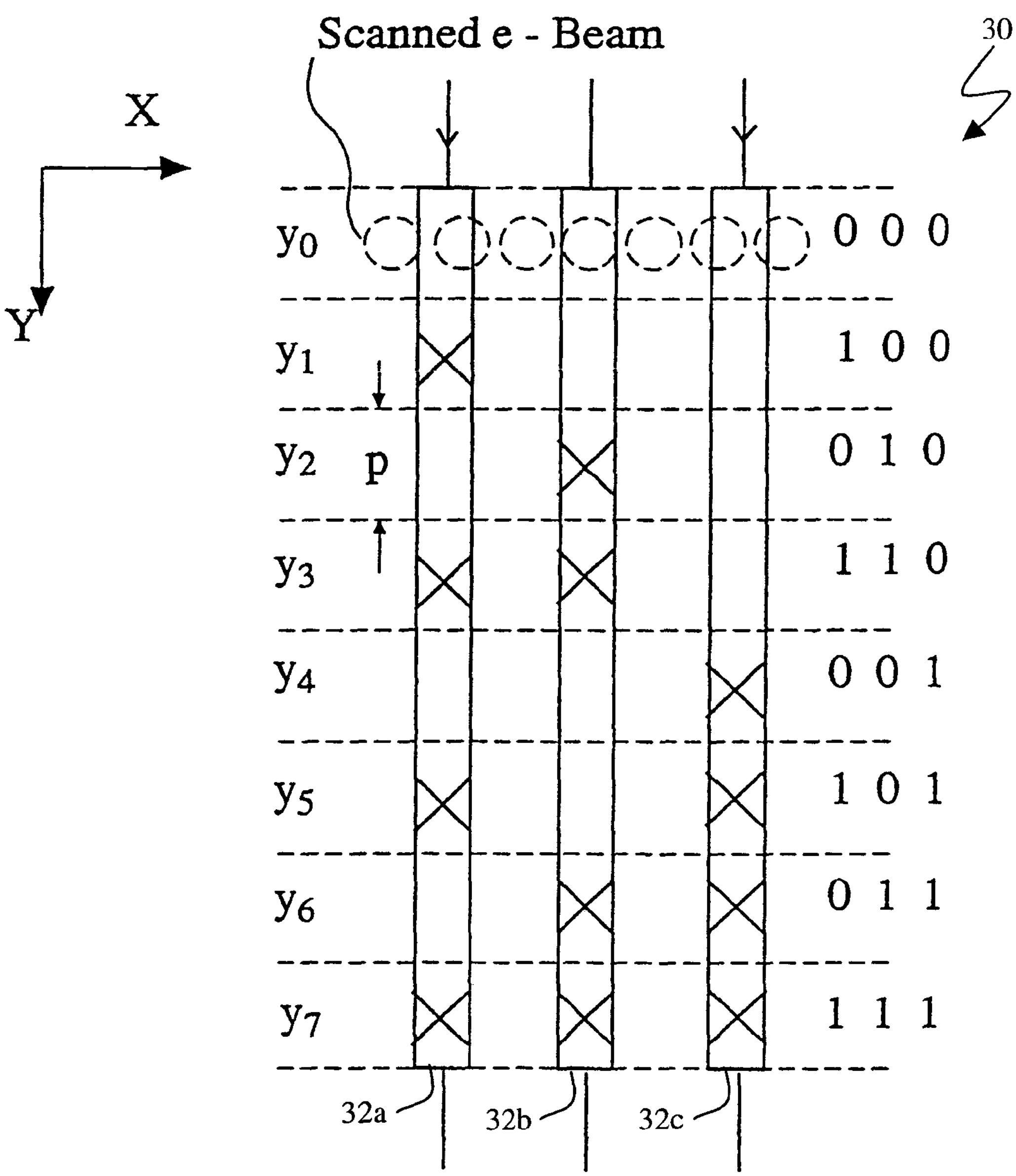
*FIG. 3* *3-bit e-beam excited superconducting ADC*

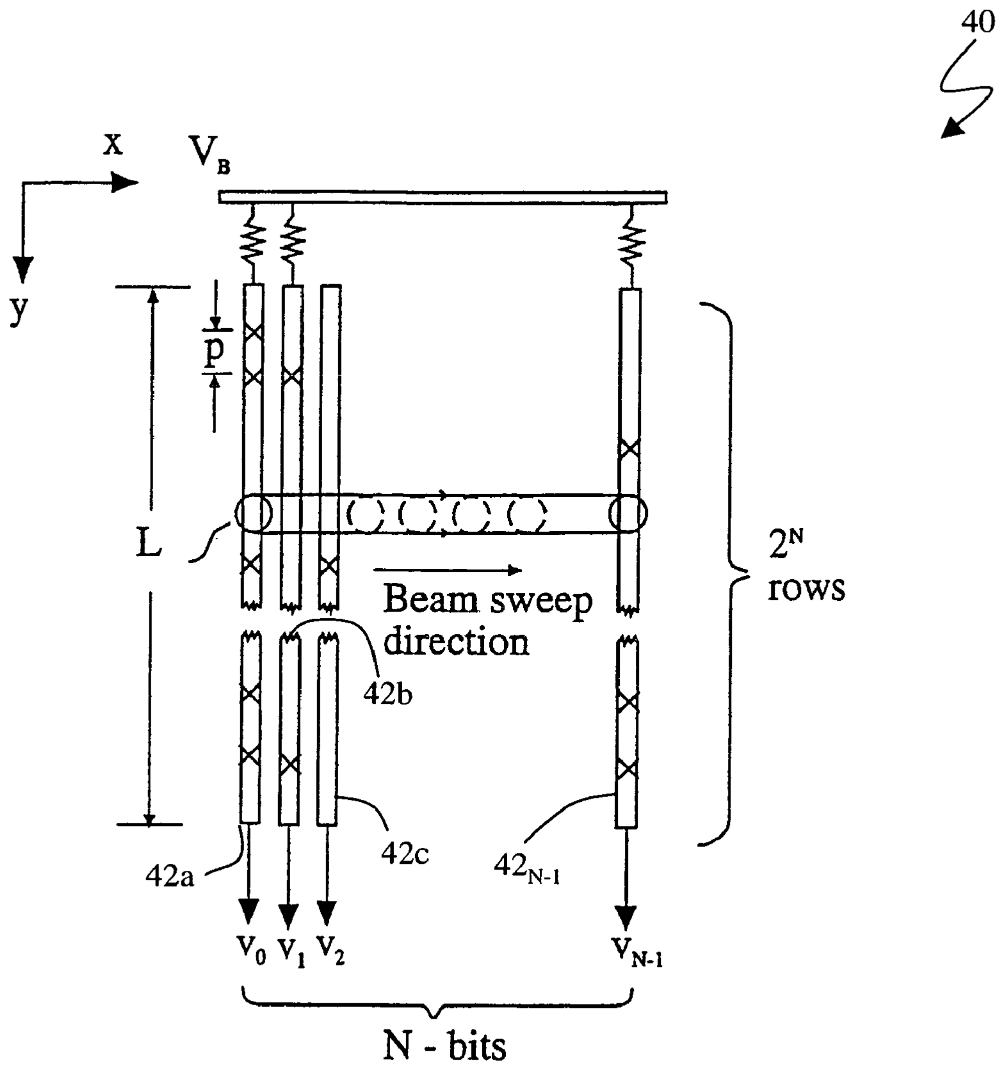
*FIG. 4* *N-bit e-beam excited superconducting ADC*
Signal Bandwidth (GHz)

Fig. 5 Performance of proposed e-beam ADC compared with other technologies
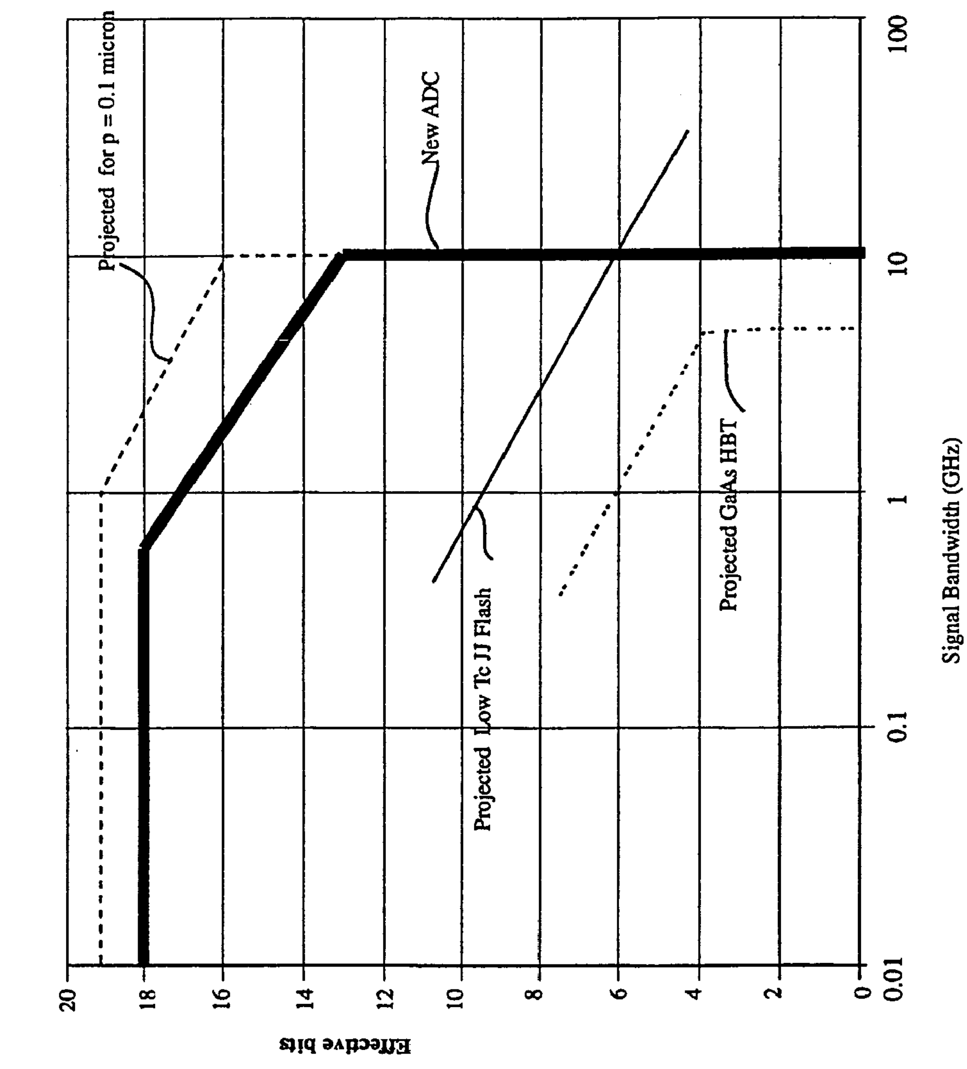

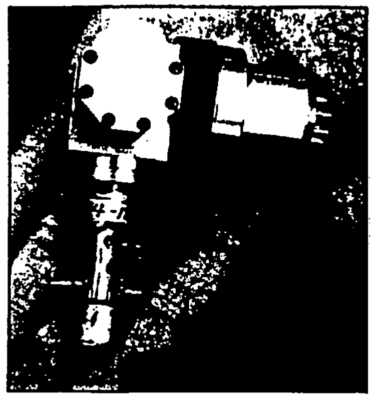
FIG. 6 - Miniature Stirling closed-cycle refrigerator built by Inframetrics Inc., N. Billerica, MA
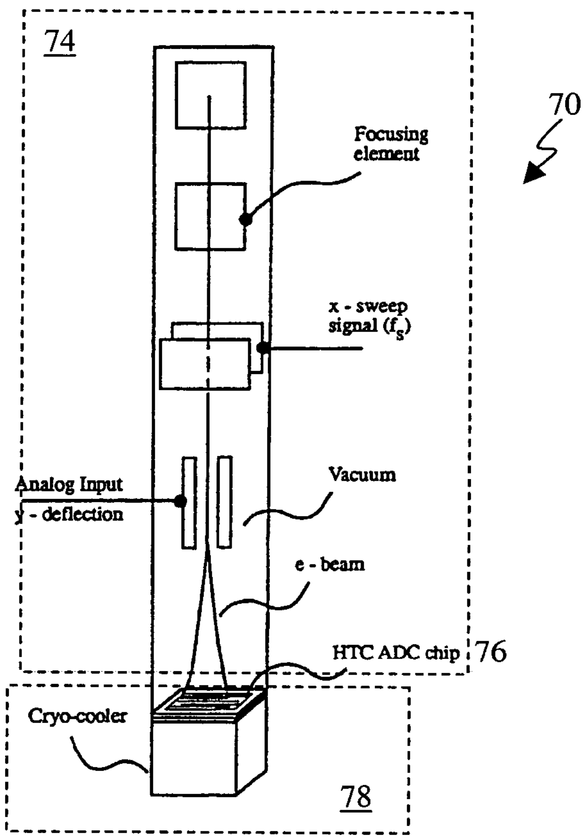
*FIG. 7 Schematic diagram of ultra-high performance ADC system*

ELECTRON BEAM EXCITED SUPERCONDUCTING ANALOG-TO-DIGITAL CONVERTER

RELATED APPLICATIONS

This application is a continuation of U.S. application Ser. No. 10/098,906 filed on Mar. 14, 2002, now U.S. Pat. No. 6,617,987.

FIELD OF THE INVENTION

The present invention relates generally to analog to digital conversion, and more particularly to a system and a method for high-speed analog to digital conversions.

BACKGROUND OF THE INVENTION

Advances in digital processing are significantly impacting many endeavors in science and technology and digital processing applications. There are many situations which require converting fast analog signals into digital representation for processing and to harness the power of digital equipment. A key element is a device know as an analog-to-digital converter (A/D converter) which is a crucial front-end in many systems. However, the performance of A/D converters is lagging behind digital processors, creating an obstacle to full digitization of numerous applications.

It would be desirable to provide A/D converters operating between 30 MHz and 3 GHz with resolution in excess of about 10 bits. These A/D converters could be used as components in radar front-ends, intercept receivers, image processing, HDTV and in many other areas. Conventional semiconducting devices have well-known system limitations and cannot meet the above performance requirements. For instance, present silicon bipolar technology achieves 4 bits at 1 GHz and GaAs heterojunction bipolar transistor (HBT) technology is projected to achieve 6 bits at 1 GHz. This leaves Josephson junction (JJ) technology as the most promising to potentially produce the performance necessary for advanced digital systems. The fastest Josephson junction flash A/D converter operated at liquid He temperature achieved 6 bits at 1 GHz, and 3 bits at 10 GHz. These low critical temperature (Tc) circuits require good quality Josephson junctions which have high non-linearity which cannot be reproduced using high Tc (HTC) superconductivity. Consequently, many known low Tc JJ circuits and concepts may not be implemented in HTC superconductivity. It is, therefore, safe to conclude that such known technologies reach their fundamental limitations at performance levels well below what is needed, and a search for new approaches is both warranted and timely.

Therefore, there remains a need in the art for a new A/D conversion system and method based on HTC superconductivity that produce performance levels orders of magnitude higher than what was thought possible using conventional low Tc JJ devices. In particular, a need exists for an A/D conversion system capable of bandwidths in excess of 10 GHz at 10-bit resolution, which is impossible to achieve by previously-known technologies.

BRIEF DESCRIPTION OF THE DRAWINGS

FIG. 1 illustrates the current-voltage characteristic of a weak link Josephson Junction device;

FIG. 2 illustrates an electron beam excited dispersionless HTC superconducting line matched at both ends and containing a weak links in series;

FIG. 3 illustrates a 3 bit electron beam excited superconducting A/D converter;

FIG. 4 illustrates a general, N-bit, beam excited superconducting A/D converter;

FIG. 5 illustrates expected performance of the exemplary embodiment electron beam analog to digital converter;

FIG. 6 shows a miniature Stirling closed cycle refrigerator; and

FIG. 7 illustrates a schematic diagram of an ultra-high performance analog to digital converter system.

SUMMARY OF THE INVENTION

The above-discussed and other problems and deficiencies of the prior art are overcome or alleviated by the several methods and apparatus of the present invention for a system and method for converting an analog voltage signal to a digital representation at high speeds, known as an analog to digital convertor (A/D converter). The invention teaches an N-bit A/D converter, made by N superconducting, preferably HTC, transmission lines. The N lines are arranged adjacently and in parallel with each other. On each line $2^{N-1}$ JJs air embedded in series. Thus JJs form a matrix over the configuration of the N superconducting transmission lines in such a manner that across the lines the JJs give N digit binary numbers, while in the length direction these N digit binary numbers fall in numerical order. A scanning electron beam is made to impinge on this arrangement. The beam is scanned across the lines at a high frequency, while it is deflected by the applied voltage signal along the direction of the lines. The beam generates a voltage step on any one of the N lines on condition of hitting any one of the JJs. In this manner upon each cross-scanning of the beam, an N-bit step voltage pattern is generated on the lines. This pattern is the direct digital readout of the input voltage signal.

The above-discussed and other features and advantages of the present invention will be appreciated and understood by those skilled in the art from the following detailed description and drawings.

DETAILED DESCRIPTION OF THE INVENTION

Herein disclosed is a novel A/D converter system and method that is based on HTC superconductivity weak link devices which produce performance levels orders of magnitude higher than what was thought possible using conventional low Tc Josephson junction (JJ) devices. The system relies on two phenomena. First, that an electron beam is deflectable within the many GHz frequency range. Second, that a Josephson Junction (JJ) switches into the voltage state upon being hit by an appropriate electron beam. This ultra-high performance A/D converter exploits the interaction of electron beams with superconducting devices and circuits. In particular, the herein disclosed system and method is capable of deflecting electron beams at bandwidths in excess of 10 GHz leading to A/D converter performance of 10 GHz bandwidth at 10-bit resolution. This is impossible to achieve with conventional technologies. This hybrid system also benefits from the important dispersionless property of superconducting transmission lines and ultra-fast switching of HTC weak links. In one embodiment, a 12-bit A/D converter having an analog bandwidth of 500 MHz to 1 GHz is possible. This is orders of magnitude higher than other technologies. In yet another embodiment A/D converter performance can be extended to 10 GHz at 12 bits.

It is well known that Josephson junctions can be made to switch from the zero voltage state to the finite voltage state when excited with an energetic electron beam. This beam generates quasi-particles which suppress the Josephson current. FIG. 1 shows the current-voltage characteristics of a JJ of the weak link type, which has a critical current $J_0$ and is current biased at a current $I_g$. When the electron beam is applied, $J_0$ is suppressed to $I'_0$, well below $I_g$, causing the device to switch from the zero voltage state to $V_0$. This device will reset back to the zero voltage state upon removal of the electron beam excitation. The switching speed of weak link type JJ devices is well known to be in the sub-picosecond range. To accomplish this, the energy of the electron beam $E_e$ must be in the order of the Josephson energy $E_j=I_0M_0/2B$ at the same time, $E_e$ must be much smaller than the superconducting condensation energy. These conditions are easily met using Josephson devices with $I_0$ in the range of 0.1 to 1 mA, and electron beam currents and voltages of a few $\mu$A's and a few KV's, respectively, and the beam excitation pulse duration in the 1–10 picosecond range.

FIG. 2 illustrates a transmission line 20 as a component of a multiple bit A/D converter system disclosed herein. The transmission line 20 is a dispersionless HTC superconducting transmission lines including plural Josephson junctions 22 in series (as represented by crosses in FIG. 2). The transmission line 20 generally has a characteristic impedance of $Z_0$, (a few Ohms) and is matched at both ends. A current supply biases the Josephson junctions at $I_g$, and, as shown above, when an electron beam hits any one of these junctions, a voltage pulse $V_0$ is created and transmitted to the output end of the line. This transmission line has a length L which defines the propagation delay, T, of a signal from the left to the right and is given by $T=L/v_p$, where $v_p$, is the transmission line phase velocity which, in practical situations, is equal to approximately one-third the speed of light. The propagation delay generally limits the bandwidth and the bits of resolution of the A/D converter.

Accordingly, an A/D converter includes N transmission lines 20 described above in FIG. 2. The operating principles are illustrated in FIG. 3, wherein an embodiment of a 3-bit A/D converter 30 is depicted. In this case, three transmission lines 32*a*, 32*b* and 32*c* are placed adjacent to each other and separated by a suitable distance to minimize crosstalk. These transmission lines 32*a*, 32*b* and 32*c* are oriented along the Y direction and an electron beam is made to sweep or scan in the X direction. Also shown in FIG. 3 are $2^3$, or eight, rows represented by $Y_0$ through $Y_7$. In the X, Y plane, a matrix identification thus created which has eight rows and three columns (three transmission lines 32*a*, 32*b* and 32*c*). A bit pattern representing the position of each row is shown by the number of Josephson junctions (cross symbol) in each row. For instance, the first row, $Y_0$, has no JJ's and the bit pattern representing the $Y_0$ position is (0,0,0). At the other end, $Y_7$, has 3 JJ's and the bit pattern is (1,1,1). To accomplish the A/D converter function one exploits the ability to scan an electron beam in the X and Y plane very rapidly. Electron beam deflection of bandwidths approaching 20 GHz is possible. In the X direction, the electron beam is swept continuously at the sampling frequency $f_s$ ($f_s$>10 GHz). The input analog signal is applied to the Y deflection system, deflecting the beam in the Y direction, to any position between $Y_0$ and $Y_7$, depending on the value of the input analog signal. For instance, when the input analog signal is zero, the electron beam will be swept in the X direction across the first row ($Y_0$) and, in this case, because there are no Josephson junctions in this row, the output voltage of the three lines is the bit pattern (0.0.0). When the input voltage is highest, the beam is deflected in the Y direction so that it crosses the eighth row, $Y_7$, and three Josephson junctions will switch (according to FIGS. 1 and 2) and the output is the bit pattern (1,1,1). Of course, when the value is in between zero and the highest value, this will cause the beam to sweep across the other rows. As the analog signal varies, the output bit pattern changes to reflect that at the sampling frequency $f_s$. It should be understood by one skilled in the art from the herein description that it is arbitrary as to whether the JJs are assigned the digit of 1 and the voids the digit of 0, or vice versa.

The 3-bit A/D converter 30 clearly relies on the zero resistance and dispersionless quality of superconducting lines, the ultra-high switching speed of Josephson junctions and the ability to deflect the electron beam in the X and Y direction in multiple GHz bandwidths.

In FIG. 4, a general A/D converter 40 for N bits is illustrated. Here, of course, N transmission lines 42*a*, 42*b*, 42*c* . . . $\mathbf{42}_{N-1}$ are needed. The rows repeat at a period p, the length of the JJ's, which is also the length of a unit of void, the shortest portion of the line without a JJ. The total length of each transmission line is $L–p2^N$. This relationship clearly shows that if L is maintained constant, as the value of p decreases, the number of bits increases, thus allowing for a wider analog bandwidth. The analog bandwidth is limited by the propagation delay T of the signal in the transmission line 42, which is related to the length of the line. The bandwidth of the A/D converter 40 may be expressed by: BW–½T.

The sampling frequency is the frequency at which the electron beam is swept in the X direction, and determines the ultimate performance of the system. The maximum analog bandwidth BW of the system cannot be larger than ½ $f_s$. As shown in FIG. 5, the performance of the A/D converter is generally bounded by three lines or regions.

The flat region is limited by the performance of the electron beam deflection bandwidth in the Y-direction, $f_s$ and the relationship $BW=f_s/2$. The analog bandwidth $BW=f_s/2$ is independent of the bits of resolution as long as the sampling period is longer than approximately 3T. For p=0.5 micron and a beam size equal to 0.5 micron in diameter and $f_s$=20 GHZ gives the maximum analog bandwidth of 10 GHZ and the maximum number of bits of N=13.

The light limited region, where N>13, the bandwidth is related to the number of bits by the following formula: $BW=(c/2np)\times(½^N)$, where, c is the speed of light, n reflects how slow the transmission line phase velocity is relative to c, and where n is assumed to be 3, and p is the pitch. From this formula one obtains N=17 bits at BW of 1 GHz.

A long length limitation in FIG. 5 is obtained because the above formula breaks down due the constraint that the transmission line length cannot be indefinitely long. Based on intuition, practical constraints such as microfabrication, electron beam scan distance, beam defocusing and others, the maximum transmission line length is about 10 cm, in this case, the A/D converter performance has a 500 MHz bandwidth at 18 bits of resolution.

It is possible to improve the performance even further as shown by the dashed curve in FIG. 5 by reducing the pitch to smaller than 0.5 micron and increasing the electron beam deflection bandwidth beyond 20 GHZ. Both are possible with sophisticated lithography and microfabrication techniques, as well as refined design of electron beam deflection systems.

From the foregoing analysis, it is clear that the invented electron beam A/D converter has orders of magnitude higher performance than the most advanced JJ-based circuits. The possibility of obtaining analog bandwidths of 10 GHz at 13 bits or 1 GHz at 17 bits is impossible to contemplate by other technologies. The key factor to achieving such ultra-high performance levels is the ability to create electron beam deflection circuits of bandwidths in excess of 10 GHz. This was demonstrated by S. M. Kocimski (IEEE Transactions On Electron Devices, Vol. 38. page 1524, June, 1991). Another important advantage of this new concept is that Josephson junctions can be of the weak link type instead of the tunnel junctions having sharp quasi particle tunneling components. The weak link can readily be made using HTC superconducting materials making it possible to use cooling at 77° K with a miniature refrigerator as shown in FIG. 6.

A primary concern with achieving deflection bandwidths of 20 GHz and beyond relates to the linearity over the dynamic range of $2^N$ when N>10. Fortunately, the disclosed A/D converter architecture can address this at the superconducting chip. Instead of having the rows repeat periodically with pitch p, certain groups of rows will have variable spacing determined by measurements of the non-linearity. This scheme, therefore, serves to minimize the non-linearity.

A preferred embodiment of an ultra-high performance A/D converter system 70 is schematically illustrated in FIG. 7. The A/D converter system 70 includes three major subsystems. An electron beam subsystem 76 generally comprises known electron beam generating systems capable of delivering an electron beam, for example, having about a 0.5 micron diameter, 0.1 $\mu$A, and voltage in the 1–5 KV range depending on the analog bandwidth desired. Depending on the performance, the X, Y deflection circuits are designed to achieve bandwidths in the range of 100 MHz to 20 GHz.

A superconducting transmission line chip 76 is also provided, which utilizes high $T_c$ superconducting transmission lines and weak link devices providing linearized transmission generally as described above with respect to FIGS. 2–4, along with appropriate insulator and resistor technologies and a regulated power supply. The chip 76 preferably includes wide bandwidth amplifiers to interface with room temperature electronics. The chip 76 should be packaged in a vacuum seal arrangement such that the top surface is in the vacuum and exposed to the electron beam excitation while the other surface is thermally connected to a cooling subsystem 78

The cooling subsystem 78 is provided to compensate for the dissipation from the superconducting circuit of a fraction of a milliwatt of power. Accordingly, the cooling constraint is not severe. Cooling may be accomplished conveniently using, for example, a miniature Stirling dosed-cycle refrigerator shown in FIG. 6, which is well known.

Additional electronics, not specifically shown in FIG. 7, such as linear-wide bandwidth amplifiers, sync generators and room temperature interface electronics, such as memory buffers and processors, also may be included as needed for the particular application.

The modifications to the various aspects of the present invention described hereinabove are merely exemplary. It is understood that other modifications to the illustrative embodiments will readily occur to persons with ordinary skill in the art. All such modifications and variations are deemed to be within the scope and spirit of the present invention as defined by the accompanying claims.

I claim:

1. A system for acquiring information on the size of a voltage signal, comprising:

N superconducting transmission lines arranged adjacently and substantially in parallel with each other giving a configuration of N substantially identical superconducting transmission lines, the configuration having two characteristic directions, a y direction, along the direction of the lines, and an x direction, directed across the lines;

a matrix of embedded Josephson Junctions (JJs) over the configuration of the N superconducting transmission lines, the matrix formed by $2^{N-1}$ of the JJs on each one of the N superconducting transmission lines, wherein the JJs are so placed as to yield N digit binary numbers in the x direction, and;

an electron beam, the electron beam impinging on the superconducting transmission lines, the electron beam being receptive to displacement along the direction of the superconducting transmission line in proportion to the size of the voltage signal, and wherein the electron beam generates a voltage step on the superconducting transmission line on condition of hitting any one of the one or more JJs; and a scanning voltage deflecting the electron beam in the x direction, wherein the electron beam periodically impinges on each one of the N superconducting transmission lines.

2. The system of claim 1, wherein the superconducting transmission lines are made of a HTC superconductor material.

3. The system of claim 2, further comprising:

a cooling subsystem, the cooling subsystem providing an ambient where the HTC superconductor material conducts current without resistance; and an electron beam subsystem, the electron beam subsystem further comprising a vacuum system.

4. A method for taking N bit digital samples of a time varying voltage signal, comprising the steps of:

providing N superconducting transmission lines, the N superconducting transmission lines arranged adjacently and substantially in parallel with each other, forming a configuration with two characteristic directions, a y direction, along the direction of the lines, and an x direction, directed across the lines;

imbedding $2^{N-1}$ Josephson Junctions (JJs) in series on each one of the N superconducting transmission lines, wherein the JJs forming a matrix over the configuration of the N superconducting transmission lines, placing the JJs as to yield N digit binary numbers in the x direction; and impinging an electron beam on the arrangement of the N superconducting transmission lines, the electron beam being deflected by a scanning voltage in the x direction, wherein the electron beam periodically impinging on each one of the N superconducting transmission lines, the electron beam also being receptive to displacement along the y direction in proportion to the size of the time varying voltage signal, and wherein the electron beam generating a voltage step on any one of the N superconducting transmission lines on condition of hitting any one of the JJs, whereby the voltage steps on the N lines yield a digital representation of the time varying voltage signal.

5. The method of claim 4, further comprising the step of selecting a HTC superconductor material for fabricating the superconducting transmission lines.

* * * * *